(12) United States Patent
Armbruster et al.

(10) Patent No.: US 9,752,897 B2
(45) Date of Patent: Sep. 5, 2017

(54) SYSTEM FOR DETECTING A READINESS OF A CLOSURE ELEMENT OF A MOTOR VEHICLE TO LOCK

(71) Applicants: Dr. Ing. h.c. F. Porsche Aktiengesellschaft, Stuttgart (DE); Magna Car Top Systems GmbH, Bietigheim-Bissingen OT (DE)

(72) Inventors: Reiner Armbruster, Muehlacker (DE); Gunnar Wilke, Neuenkirchen-Voerden (DE)

(73) Assignees: Dr. Ing. h.c. F. Porsche Aktiengesellschaft (DE); Magna Car Top Systems GmbH (DE)

( * ) Notice: Subject to any disclaimer, the term of this patent is extended or adjusted under 35 U.S.C. 154(b) by 0 days.

(21) Appl. No.: 14/596,345

(22) Filed: Jan. 14, 2015

(65) Prior Publication Data
US 2015/0203027 A1    Jul. 23, 2015

(30) Foreign Application Priority Data

Jan. 17, 2014   (DE) .................. 10 2014 100 508

(51) Int. Cl.
*B60Q 1/26* (2006.01)
*G01D 5/12* (2006.01)
(Continued)

(52) U.S. Cl.
CPC .......... *G01D 5/12* (2013.01); *H03K 17/9517* (2013.01); *B60J 7/185* (2013.01)

(58) Field of Classification Search
CPC .. G01D 5/12–5/147; B60J 7/185; B60Q 1/26; H03K 17/9517
(Continued)

(56) References Cited

U.S. PATENT DOCUMENTS 6,666,482 B2   12/2003  Hansen
7,004,538 B2 *  2/2006  Kitoh .................... B60J 7/0573
                                               296/216.02
(Continued)

FOREIGN PATENT DOCUMENTS

DE   10 2011 000 391   5/2012
DE   20 2013 000 163   6/2013

OTHER PUBLICATIONS

Betz, Jochen; German Patent DE 10 2011 000391 B3; Translation of Sensor system for use in closure device for detecting locking stand-by position of convertible soft top of cabriolet vehicle, has permanent magnet polarized toward other magnets to produce magnetic field in vice versa; May 31, 2012; WIPO Patentscope, Google Translate; All pages.*

(Continued)

*Primary Examiner* — Melissa Koval
*Assistant Examiner* — Rahul Maini
(74) *Attorney, Agent, or Firm* — Gerald E. Hespos; Michael J. Porco; Matthew T. Hespos

(57) ABSTRACT

A system (1) for detecting a readiness of a closure element (10) of a motor vehicle to lock has a first sensor (12) for detecting a position signal of the closure element (10) and a second magnetic sensor (14) for detecting a magnetic field signal (18). The first sensors (12, 14) are connected by a data link to an electronic unit (20), and the magnetic field signal (18) and the position signal are passed by a data link to the electronic unit (20). The electronic unit (20) has a memory (22) with at least one stored magnetic field signal value (24). The electronic unit (20) generates a change in the output signal when there is a positive comparison of the magnetic field signal value (24) with the detected magnetic field signal (18), and when an end position of the closure element (10) is detected.

20 Claims, 2 Drawing Sheets

(51) Int. Cl.
    *H03K 17/95* (2006.01)
    *B60J 7/185* (2006.01)
(58) Field of Classification Search
    USPC ............... 324/207.11–207.26; 296/98–225
    See application file for complete search history.

(56) References Cited

U.S. PATENT DOCUMENTS

| | | | |
|---|---|---|---|
| 7,104,206 B2 | 9/2006 | Jones | |
| 7,699,379 B2* | 4/2010 | Righetti | B60J 7/19 |
| | | | 296/128 |
| 7,806,460 B2* | 10/2010 | Jahn | B60J 7/0573 |
| | | | 296/107.09 |
| 8,960,767 B1* | 2/2015 | Hooton | B60J 7/1851 |
| | | | 296/121 |
| 9,168,894 B2* | 10/2015 | Ovenshire | B60R 25/10 |
| 2007/0139195 A1* | 6/2007 | Jin | G08B 13/08 |
| | | | 340/547 |
| 2014/0062466 A1* | 3/2014 | Thibault | G01B 7/14 |
| | | | 324/207.22 |

OTHER PUBLICATIONS

German Search Report of Nov. 18, 2014.
Austrian Office Action Dated Nov. 9, 2016.

\* cited by examiner

SYSTEM FOR DETECTING A READINESS OF A CLOSURE ELEMENT OF A MOTOR VEHICLE TO LOCK

CROSS REFERENCE TO RELATED APPLICATION

This application claims priority under 35 USC 119 to German Patent Appl. No. 10 2014 100 508.2 filed on Jan. 17, 2014, the entire disclosure of which is incorporated herein by reference.

BACKGROUND

1. Field of the Invention

The invention relates to a system for detecting a readiness of a closure element of a motor vehicle to lock. The invention also relates to a method for detecting a readiness of a closure element of a motor vehicle to lock.

2. Description of the Related Art

DE 10 2011 000 391 B3 discloses a system for locking a closure element of a motor vehicle. The system has a first sensor that can detect a defined position of a closure element and a second sensor in the form of a reed switch. The reed switch switches when a specific magnetic field strength value is generated by a magnet arranged on a pivotable soft top of a convertible vehicle. The magnet pivots with the soft top into the vicinity of the reed switch, and the specific magnetic field strength value is achieved when the magnet reaches a specific position on the reed switch. However, triggering the reed switch only after a specific magnetic field strength value has been achieved is disadvantageous in that the specific magnetic field strength value has to be overridden by the magnet. A weaker magnet cannot be used, for example, in the case of an exchange, thereby restricting usability of the system.

The object of the invention is to provide a system and a method for detecting a readiness of a closure element of a motor vehicle to lock, and to achieve this object with a simple and cost-effective design and with various magnetic field signals.

SUMMARY OF THE INVENTION

The invention relates to a system for detecting a readiness of a closure element of a motor vehicle to lock. In this context, the system has a first sensor for detecting a position signal of the closure element and a second magnetic sensor for detecting a magnetic field signal. The first sensor and the second magnetic sensor are connected by a data link to an electronic unit. In this context, a magnetic field signal and the position signal are passed by a data link to the electronic unit. The electronic unit has a memory with at least one stored magnetic field characteristic variable. The electronic unit generates a change in the output signal at an output of the electronic unit when there is a positive comparison of the magnetic field characteristic variable with the magnetic field signal and when an end position of the closure element is detected. In this context a value of a magnetic field strength can be taken into account as a magnetic field characteristic variable. A magnetic field characteristic variable can be, for example, a value between −67 mT and +67 mT. A magnetic field characteristic variable also can be defined as a value in a specific voltage range, for example a voltage range from −1 V to +1 V, wherein the voltage can be caused by an induced voltage of the second magnetic sensor, caused by the magnetic field signal. The term magnetic field signal is to be understood within this document as meaning a state where, for example, the magnetic field signal can be a magnetic field strength. A magnetic field signal also may be understood as being a pulsed, emitting magnetic field with a specific magnetic field strength by means of an electromagnet. For example information can be transmitted by the pulsed magnetic field signal. Various magnetic field signals can be stored in the memory of the electronic unit. A change in the output signal occurs at the output of the electronic unit when there is a positive comparison of the magnetic field signal value with the detected magnetic signal and when an end position of the closure element is detected. The output signal of the electronic unit can initially have a low level, such as 0 V. A positive comparison of the magnetic field signal value with the detected magnetic field signal can be carried out by a detected magnetic field signal in the form of a detected magnetic field strength reaching a specific threshold value of a magnetic field strength. In this context the threshold value of the magnetic field strength, i.e. in this case the magnetic field signal value, can be, for example 50 mT. The magnetic field signal value can be stored in a variable fashion in the memory of the electronic unit. Plural magnetic field signal values may be stored in the electronic unit. In this context, before the system is activated a specific magnetic field signal value can be determined and may bring about triggering of the change in the output signal at the output of the electronic unit. The selection from the stored magnetic field signal values can be carried out by a user of the system. It is therefore possible for the user to determine, by means of an interface of the electronic unit, which magnetic field signal value is to bring about triggering of the change in the output signal, before the installation of the system, for example in a motor vehicle.

The second magnetic sensor may detect a measurement of the field strength of the magnetic field signal and/or an identification of the magnetic field signal. As a result a magnetic field approaching the second magnetic sensor can be detected by a linear Hall sensor that can output a linear level corresponding to the field strength of the approaching magnetic field. The linear level can then be passed to the electronic unit. The electronic unit then may compare the corresponding linear detected level with the stored magnetic field signal value. The change in the output signal at the output of the electronic unit can take place when the stored magnetic field signal value is exceeded by the detected level and at the same time an end position of the closure element is detected. In this context, the change in the output signal at the output of the electronic unit from a low level to a high level or from a high level to a low level can take place. The low level may be 0 Volts and the high level, for example, 5 Volts. The magnetic field signal of the magnetic field that is approaching the second magnetic sensor may be identified. The corresponding approaching magnetic field at the second magnetic sensor can be detected with a magneto-resistive angle sensor that can measure the field strength and identify the magnetic field. As a result, measurement of the field strength and identification of the magnetic field signal can be carried out by means of the magneto-resistive angle sensor, used as a second magnetic sensor.

The use of a Hall sensor as the first sensor permits contact-free detection of a magnetic field. In this context, the Hall sensor supplies an output voltage that is proportional to the magnetic field strength and the current running through it. This means that the output voltage of the Hall sensor varies directly with the strength of the revolving magnetic field that surrounds the Hall sensor. Accordingly, the end position of the closure element can be detected in a contact-free fashion. The first sensor may be a simple on and off switch. In this context, a momentary contact switch can be used and switches when contact occurs. Detection of the end position of the closure element takes place if the closure element contacts the momentary contact switch. The advantage of a simple on and off switch is its cost-effective manufacture, as a result of which the entire locking device can be manufactured more cost-effectively.

A second electronic unit may be arranged electrically at the output and has at least a second output. The second output can be loaded energetically to a greater extent than the output of the electronic unit. The output of the electronic unit may take place, for example, via an output of a TTL gate. A voltage at the output of the TTL gate can be between, for example 0 V and 5 V. The power drain of the TTL gate can be, for example between 4 mA and 20 mA. A maximum power output at the output of the TTL gate would therefore be given by $P=U\times I$ corresponding, for example, to $P=5$ $V\times 20$ mA=0.1 W possibly. As a result, electromechanical devices, for example electric motors with an extremely low power drain, can be operated. Amplification therefore is necessary to operate electric motor components with a relatively high power. For this purpose, the second electronic unit can be an amplifier. The second electronic unit can draw a relatively high tapable electric power at the second output in the case of a change in the output signal at the output of the electronic unit. As a result, electromechanical components can be operated with a relatively high power. This is appropriate, for example, for electromechanical activation of the closure element by an electromechanical component. It is therefore possible to transfer the closure element electromechanically into a closed state, for example by means of an electric motor. Furthermore, the second electronic unit may have a further output that can be used for displaying the readiness of the closure element of the motor vehicle to lock. For example a driver information system of a motor vehicle can be used as a display. An acoustic indication also is conceivable.

The electronic unit and/or second electronic unit may be connected to a field bus by a data link. The field bus enables all of the information to be transmitted via a line. As a result, the electronic unit and/or second electronic unit can be controlled via the field bus. The electronic unit and/or second electronic unit can be a control unit that can exchange data from one another via the field bus. In addition, a central computing unit can be used to receive data from the field bus and to transmit specific data to individual control units. Thus, a central computing unit can transmit data to the control unit, i.e. electronic unit and/or second electronic unit, via the field bus. In the simplest case this can be, for example, switching on and off of an electromechanical drive of the closure element. The cabling expenditure within the motor vehicle can be reduced considerably by using a field bus in a motor vehicle. Further control units can be connected to the field bus, and all of the control units can exchange data with one another via the field bus. A LIN bus or CAN bus can be used as the field bus.

A magnet may be arranged on the closure element, for example by bonding. The closure element can be fabricated from plastic. Thus, the generated field lines are not disrupted significantly. The closure element can be manufactured from a ferromagnetic material that has a high permeability and a low reminisce. As a result, the closure element can bring about magnetic shielding of the arranged magnet in a specific direction by the closure element. In the event of the closure element being constructed from plastic, the magnet can be arranged in the closure element, with the result that the magnet is surrounded completely by the plastic of the closure element. The magnet therefore is protected effectively against external environmental influences, as a result of which longer durability of the magnet can be achieved.

The invention also relates to a method for detecting a readiness of a closure element of a motor vehicle to lock. In this context, the method has the following steps:
  detecting a position signal of the closure element,
  detecting a magnetic field signal,
  generating a change in the output signal at an output at an electronic unit when there is a positive comparison of the magnetic field signal with a magnetic field signal value stored in the electronic unit and when an end position of the closure element is detected.

This method advantageously detects a readiness to lock by detecting the end position of the closure element and a positive comparison of the magnetic field signal with a magnetic field signal value stored in the electronic unit. In this context, plural magnetic field signal values advantageously can be stored in the electronic unit. The magnetic field signal can be detected by a second magnetic sensor. In this context, a magnet, for example an electromagnet, can be moved toward the second magnetic sensor. The closer the magnet is moved to the second magnetic sensor, the stronger the detection of the magnetic field strength by the magnetic sensor. The magnet therefore generates a specific magnetic field strength given a specific position of the magnet with respect to the second magnetic sensor. For example the magnetic field strength may be 50 mT when the magnet is positioned directly against the second magnetic sensor. Thus, in this example, 50 mT can be stored as the magnetic field signal value in the memory of the electronic unit. If the magnet is positioned directly against the magnetic sensor and if the second magnetic sensor detects the 50 mT, a positive comparison of the magnetic field signal with the magnetic field signal value is carried out by the electronic unit, and a change in the output signal at the output of the electronic unit is generated. The change in the output signal at the output of the electronic unit can be a trigger for transferring the closure element into a locked state. In this context, the closure element can be used to lock a lid of a trunk of a motor vehicle, a door of a motor vehicle or a soft top of a convertible vehicle. In this context, a magnet with a specific magnetic field signal advantageously can be replaced by a replacement magnet with a relatively low magnetic field signal and a relatively low magnetic field strength. Thus, another magnetic field signal value merely needs to be stored in the memory of the electronic unit. The method and system of the invention then advantageously is ready for immediate use to evaluate another magnetic field signal. The replacement can take place, for example, manually by a data-link interface that can be located at the electronic unit. It is therefore conceivable that the replacement magnet generates, for example, a maximum field strength of 30 mT when the magnet is positioned directly against the sensor. If the stored value of 50 mT would continue to exist in the electronic unit, it would not under any circumstances result in a positive comparison of the magnetic field signal with the magnetic field value stored in the electronic unit. Therefore, only the replacement of the magnetic field value in the electronic unit is necessary for use of the system and method according to the invention. It is therefore possible to use replacement magnets with a relatively low magnetic field strength. Of course, magnets with a relatively high magnetic field strength also can be used merely by replacing the magnetic field signal value of the correspondingly used magnetic field signal in the electronic unit. It is therefore possible to evaluate various magnetic field signals by the electronic unit. For example, magnetic field signals can be used in which the magnetic field strength changes over time. Pulsed magnetic field signals also are conceivable.

Upward transgression of a threshold value of the magnetic field signal value may be detected to determine the positive comparison. As a result, a specific magnetic field signal value does not have to be reached by the detected magnetic field signal for a positive comparison. It can be sufficient that the threshold value of the magnetic field signal value is exceeded once by the magnetic field signal to arrive at a positive comparison and thereby at a change in the output signal when an end position of the closure element is detected at the same time. The threshold value of the magnetic field signal value can have a lower range and an upper range so that the threshold value covers a specific range. It is therefore conceivable that when a threshold value, for example 50 mT is exceeded, the positive comparison is achieved, but a maximum upward transgression of the threshold value up to, for example, 70 mT can also be evaluated. It is therefore effectively ruled out that relatively strong magnetic field signals that are not associated with the system can be filtered out.

Further measures and advantages of the invention can be found in the claims, the following description and the drawings. In this context, the features mentioned in the claims and those mentioned in the description can each be essential to the invention individually per se or in any desired combination.

DETAILED DESCRIPTION

Figure 1:
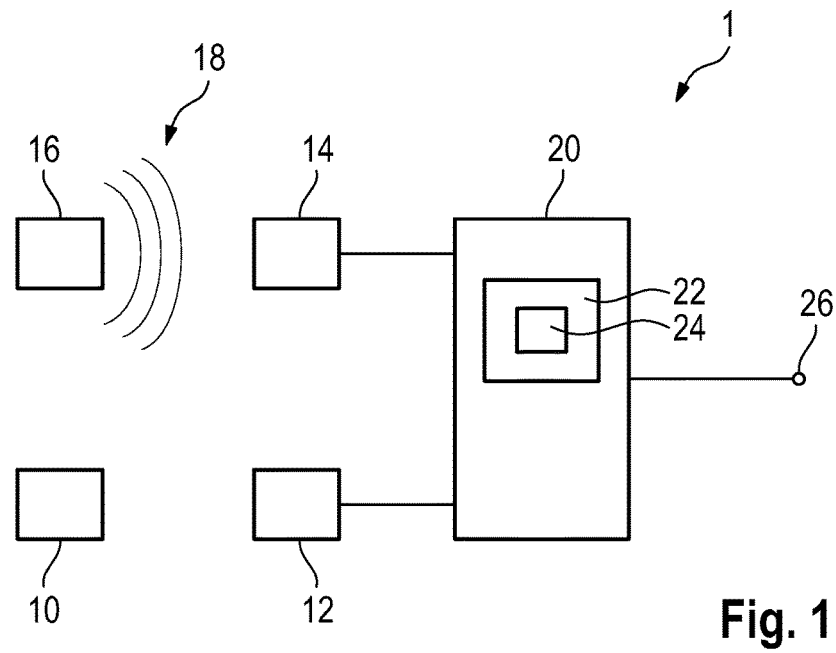
FIG. 1 is a schematic view of a system for detecting a readiness of a closure element of a motor vehicle to lock.

FIG. 1 is a schematic illustration of a system 1 for detecting a readiness of a closure element 10 of a motor vehicle to lock. A first sensor 12 for detecting an end position of the closure element 10 by means of a data link is arranged on an electronic unit 20. A second magnetic sensor 14 also is connected by a data link to the electronic unit 20. In this context, detected signals can be transmitted from the first sensor 12 and the second magnetic sensor 14 to the electronic unit 20 in a cable-bound or wireless fashion. The first sensor 12 is in the simplest case a simple on/off switch, such as a momentary contact switch. Thus, an end position of the closure element 10 can be detected when the closure element 10 is in contact with the momentary contact switch 12. However, the first sensor 12 also can be a Hall sensor that can detect when the Hall sensor 12 approaches the closure element 10. For this purpose, the closure element 10 can have an auxiliary magnet with a specific magnetic field signal. The second magnetic sensor 14 can register a magnetic field signal 18 generated by a magnet 16. The magnet 16 can be an electromagnet or permanent magnet. The closer the magnet 16 approaches the second magnetic sensor 14, the higher the value of the detected magnetic field signal 18, which value is detected by the second magnetic sensor 14. The electronic unit 20 has a memory 22, and a stored magnetic field signal value 24 is stored in the memory 22. The electronic unit 20 can carry out a positive comparison of the detected magnetic field signal 18 with the stored magnetic field signal value 24 by the second magnetic sensor 14. A change in the output signal takes place at an output 26 of the electronic unit 20 when the magnetic sensor 14 senses a positive comparison of the magnetic field signal value 24 with the detected magnetic field signal 18 and when at the same time the end position of the closure element 10 is detected by the sensor 12. The output signal 26 can be a low level, with low level defined with 0 V. A range of the low level also can be defined, with the result that the low level is defined, for example, in a range from 0 V to 0.8 V. When there is a positive comparison of the magnetic field signal value 24 with the detected magnetic field signal 18 and when at the same time an end position of the closure element 10 is detected, the output signal 26 can be changed from, for example, a low level to a high level. In this context, the high level can assume, for example, a value of 5 V. The high level can, like the low level, have a specific range, and can be defined in a range of, for example, 4.4 V to 5.4 V. Other changes in the output signal also can be generated at the output 26. In this context, when there is a positive comparison of the magnetic field signal value with the detected magnetic field signal, the output signal can be changed from a 0 V level also to, for example, a sinusoidal signal or the like.

Figure 2:
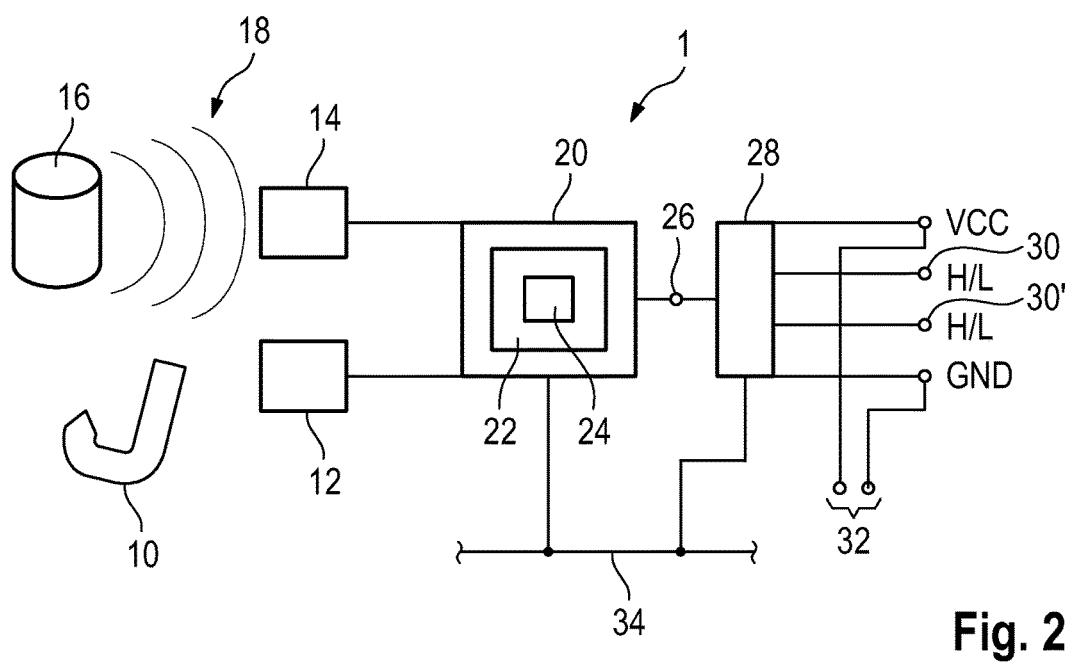
FIG. 2 is a schematic view of a system for detecting a readiness of a closure element of a motor vehicle to lock, having a second electronic unit.

FIG. 2 illustrates a schematic view of a system 1 for detecting a readiness of a closure element 10 of a motor vehicle to lock. The locking element 10 is embodied here as a hook. This hook can be used to lock a part of a motor vehicle. In this context, the part of the motor vehicle can be an element of a trunk, a vehicle door or a soft top of a convertible vehicle. In this context, a position of the closure element 10 can be detected by a first sensor 12. In this context, in the simplest case an on/off switch can be used for the sensor 12 and can be a momentary contact switch. An end position of the closure element 10 can be detected when the closure element 10 comes into contact with the momentary contact switch 12. In this context, the first sensor 12 can be a Hall sensor. Thus, a change in the magnetic field can be detected by the first sensor 12 when a magnet on the closure element 10 approaches. The first sensor 12 is connected by a data link to a computing unit 20. The connection of the first sensor 12 can be made in a wireless or wire-bound fashion. A second magnetic sensor 14 is arranged on the computing unit 20 and can detect a magnetic field signal 18 of a magnet 16. When the magnet 16 approaches the second magnetic sensor 14, a linear level can be detected by the second magnetic sensor 14, and the linear level can be passed on to the computing unit 20. The magnet 16 can be a permanent magnet or electromagnet. The second magnetic sensor can be a Hall sensor, and a level that corresponds to the magnetic field strength can be detected by the Hall sensor. The second magnetic sensor 14 also can be a magneto-resistive sensor. A magneto-resistive sensor, in particular a magneto-resistive angle sensor, can permit both measurement of the field strength and identification of the magnetic field signal 18. The second magnetic sensor 14 is connected by a data link to the computing unit 20. The connection can be made in a wireless or wire-bound fashion. The computing unit 20 has here a memory 22 with a stored magnetic field signal value 24 or a plurality of magnetic field signal values 24. A change in the output signal takes place at an output 26 of the electronic unit 20 when the end position of the closure element 10 is detected and there is a positive comparison of the magnetic field signal value 24 with the detected magnetic field signal 18. The output 26 is connected electrically to a second electronic unit 28. A switching signal can be obtained at a second output 30 by the second electronic unit 28. The switching signal 30 can be loaded to a greater extent energetically than the change 26 in the output signal. Accordingly, the second electronic unit 28 can serve as an amplifier for a change in the output signal at the output 26. A high level can occur at the second output 30 when there is a change in the output signal. The high level can be a specific number of volts, for example 24 volts, and a relatively high current can also be extracted at the output 30. As a result, for example electromechanical terminals can be connected to the output 30, and the terminals can have a power drain of several Watts. In addition, a second output 30' can be arranged at the second electronic unit 28, and only an indication of the readiness to lock can be displayed by means of the second output 30'. The indication of the readiness to lock can occur in the form of a level switch from a low level to a high level. In this context, the low level can be 0 V, and the high level can be, for example 5 V. If the high level of 5 V is present at the second output 30' this signal can be passed on to a, for example, driver information system. As a result, it is possible to indicate to a user of a motor vehicle that the readiness of the closure element 10 to lock is achieved. The second electronic unit 28 can have a voltage input 32 that is accessible from the outside. An external voltage can be applied to the second electronic unit 28 at the voltage input 32, denoted here by VCC and GND. GND stands for ground and VCC stands for voltage common collector. As a result, when the second output 30 switches from a low level to a high level, this electrical energy can be used to operate an electromechanical component. The first electronic unit 20 and the second electronic unit 28 are connected here to a field bus 34 by a data link. Data can be exchanged between the first electronic unit 20 and the second electronic unit 28 via the field bus 34, and vice versa. In this context, further control units can be connected to the field bus 34, and data can be exchanged via the control units. The field bus can be a LIN bus or a CAN bus.

Figure 3:
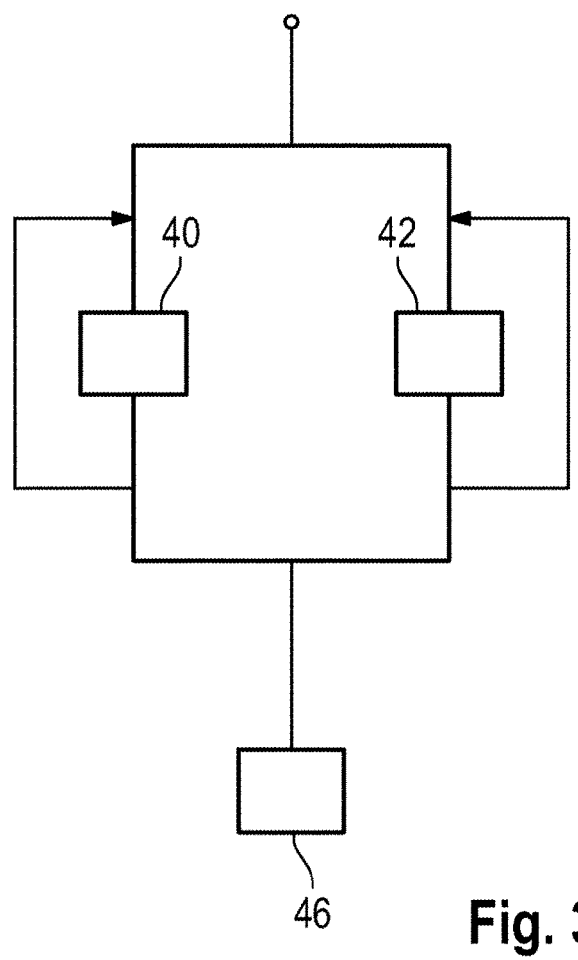
FIG. 3 is a flowchart of a method for detecting a readiness of a closure element of a motor vehicle to lock.

FIG. 3 illustrates a flowchart of the method according to the invention. In a first step 40, a position signal of a closure element is detected. At the same time, a magnetic field signal is detected in a step 42. A permanent comparison or chronologically limited comparison of a stored magnetic field signal value in an electronic unit can be carried out with the detected magnetic field signal. Likewise, the end position can be detected continuously or in a chronologically limited fashion by means of a second sensor. Intervals for the detection or the comparison are also conceivable here. In a third step 46, a change in the output signal takes place at an output on the electronic unit when there is a positive comparison of the magnetic field signal with a magnetic field signal value which is stored in the electronic unit and when an end position of the closure element is detected.

It is advantageous here that upward transgression of a threshold value of the magnetic field signal value is detected in order to determine the positive comparison. The positive comparison which takes place in the third step 46 can be refined by the method of upward transgression of a threshold value. In this context, when the threshold value is exceeded a single time by the magnetic field signal, the change in the output signal can be continuously retained. This ensures that when the threshold value is exceeded a single time above the magnetic field signal value, caused by a corresponding magnetic field signal, a readiness of a closure element of the motor vehicle to lock is reliably detected.

What is claimed is:

1. A system for detecting readiness of a closeable element of a motor vehicle to be locked, comprising:
   a first sensor for detecting a position signal related to a position of the closeable element;
   a second sensor for detecting a magnetic field signal related to a distance from the second sensor to a magnet, the magnet being arranged on the closeable element;
   a first electronic unit connected by at least one data link to the first and second sensors, the at least one data link being configured to communicate both the position signal and the magnetic field signal to the first electronic unit; and
   an electromechanical component configured to transfer the closeable element to a locked state;
   wherein the first electronic unit comprises a memory configured to store at least a magnetic field signal value;
   wherein the first electronic unit is configured for generating a change in an output signal at an output of the first electronic unit to indicate readiness of the closeable element to be locked when two conditions are met, a first condition being met when the position signal indicates that a closed position of the closeable element has been reached, and a second condition being met when there is a positive comparison of the magnetic field signal value with respect to the magnetic field signal detected by the second sensor; and
   wherein, in response to the change in the output signal indicating readiness of the closeable element to be locked, the electromechanical component initiates a locking operation to lock the closeable element.

2. The system of claim 1, wherein the second sensor is configured to detect a measurement of the field strength of the magnetic field signal and/or is configured to identify the presence or absence of the magnetic field signal.

3. The system of claim 2, wherein the first sensor is a Hall sensor.

4. The system of claim 1, further comprising a second electronic unit arranged electrically at the output of the first electronic unit, the second electronic unit configured to provide an amplified signal to the electromechanical component.

5. The system of claim 4, wherein at least one of the first electronic unit and second electronic unit are connected to a field bus by at least a second data link.

6. The system of claim 4, wherein at least one of the first sensor and the second sensor is connected wirelessly to the first electronic unit by at least one wireless data link.

7. The system of claim 1, wherein the magnet is arranged on or inside the closeable element.

8. The system of claim 1, wherein the magnet is an electromagnet.

9. The system of claim 1, wherein the magnet is a permanent magnet.

10. The system of claim 1, wherein the second sensor is a Hall sensor.

11. The system of claim 1, wherein the second sensor is a magneto-resistive sensor.

12. A method for detecting readiness of a closure element of a motor vehicle to be locked, comprising:
   detecting a position signal indicative of a position of the closure element;
   detecting a magnetic field signal indicative of a distance between a sensing element and a magnet, the magnet being attached to the closure element;

generating a change in an output signal at an output of an electronic unit to indicate readiness of the closure element to be locked when first and second conditions are met, the first condition being met when an end position of the closure element is detected, and the second condition being met when there is a positive comparison of the magnetic field signal with a predetermined magnetic field signal value stored in the electronic unit.

13. The method of claim 12, further comprising detecting upward transgression of a threshold value of the magnetic field signal value to determine the positive comparison.

14. A locking system of a motor vehicle, the locking system comprising:
- a first sensor for detecting a position signal related to a position of a closeable element;
- a second sensor for detecting a magnetic field signal related to a distance between the second sensor and a magnet, the magnet being arranged on the closeable element; and
- a first electronic unit configured to detect readiness of the closeable element to be locked when first and second conditions are met, the first condition being met when a closed position of the closeable element is detected, and the second condition being met when a positive comparison of the magnetic field signal with respect to a predetermined magnetic field reference value is detected.

15. The locking system of claim 14, wherein the first condition is met when the closeable element contacts the first sensor.

16. The locking system of claim 14, wherein the first sensor includes an on-off switch.

17. The locking system of claim 14, wherein at least one of the first sensor and second sensor is a Hall sensor.

18. The locking system of claim 14, wherein the second sensor is a magneto-resistive sensor.

19. The locking system of claim 18, wherein the magneto-resistive sensor is further configured to identify the presence or absence of the magnetic field signal.

20. The locking system of claim 14, wherein the closeable element is part of a system including one of a convertible top, door, and trunk of the motor vehicle.

* * * * *